(12) United States Patent
Darnon et al.

(10) Patent No.: US 8,475,667 B2
(45) Date of Patent: Jul. 2, 2013

(54) METHOD OF PATTERNING PHOTOSENSITIVE MATERIAL ON A SUBSTRATE CONTAINING A LATENT ACID GENERATOR

(75) Inventors: Maxime Darnon, Yorktown Heights, NY (US); Pratik P. Joshi, Yorktown Heights, NY (US); Qinghuang Lin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 364 days.

(21) Appl. No.: 12/820,904

(22) Filed: Jun. 22, 2010

(65) Prior Publication Data

US 2011/0311781 A1   Dec. 22, 2011

(51) Int. Cl.
*H01B 13/00* (2006.01)

(52) U.S. Cl.
USPC .............................................. 216/13; 216/81

(58) Field of Classification Search
USPC ................. 216/41, 13, 81; 977/742, 743, 745
See application file for complete search history.

(56) References Cited

U.S. PATENT DOCUMENTS

| | | | |
|---|---|---|---|
| 5,212,043 A | 5/1993 | Yamamoto et al. | |
| 5,212,046 A | 5/1993 | Lamola et al. | |
| 5,296,332 A | 3/1994 | Sachdev et al. | |
| 6,087,064 A | 7/2000 | Lin et al. | |
| 6,132,926 A | 10/2000 | Jung et al. | |
| 6,514,664 B1 * | 2/2003 | Touky et al. | 430/270.1 |
| 7,041,748 B2 | 5/2006 | Lin et al. | |
| 7,056,840 B2 | 6/2006 | Miller et al. | |
| 7,709,177 B2 | 5/2010 | Angelopoulos et al. | |
| 2008/0286467 A1 | 11/2008 | Allen et al. | |
| 2009/0291389 A1 | 11/2009 | Allen et al. | |

FOREIGN PATENT DOCUMENTS

| | | |
|---|---|---|
| EP | 0789278 A2 | 8/1997 |
| EP | 0794458 A2 | 9/1997 |
| WO | WO-9637526 A1 | 11/1996 |
| WO | WO-9733198 A1 | 9/1997 |

* cited by examiner

*Primary Examiner* — Roberts Culbert
(74) *Attorney, Agent, or Firm* — Novak Druce Connolly Bove + Quigg LLP; Louis J. Percello, Esq.

(57) ABSTRACT

The present disclosure relates to a method of patterning a photosensitive material on a polymeric fill matrix comprising at least one latent photoacid generator; and a structure prepared according to said method. The method comprises:

a. depositing a polymeric fill matrix comprising at least one latent photoacid generator;

b. curing the polymeric fill matrix;

c. depositing a layer of photosensitive material directly onto the cured polymeric fill matrix; and d. forming a pattern with at least one opening in the layer of photosensitive material with lithography.

20 Claims, 3 Drawing Sheets

METHOD OF PATTERNING PHOTOSENSITIVE MATERIAL ON A SUBSTRATE CONTAINING A LATENT ACID GENERATOR

FIELD OF THE DISCLOSURE

The present disclosure relates to a method of patterning photosensitive material on a polymer fill matrix, wherein the polymer fill matrix comprises at least one latent photoacid generator. The disclosure further relates to a structure prepared according to said method.

BACKGROUND

Carbon nanotubes (CNTs; sometimes referred to as buckytubes) are allotropes of carbon with a cylindrical nanostructure. These cylindrical carbon molecules have novel electrical, mechanical, thermal and chemical properties that make them useful in applications such as nanotechnology, electronics, optics and other fields of materials science. They exhibit extraordinary strength and unique electrical properties, and are efficient thermal conductors.

Nanotubes are members of the fullerene structural family, which also includes the spherical buckyballs. The ends of a nanotube might be capped with a hemisphere of the buckyball structure. Their name is derived from their size, since the diameter of a nanotube is on the order of a few nanometers (approximately 1/50,000th of the width of a human hair), while they can be up to 18 centimeters in length. Iijima, S, Nature 354, 56-58 (1991), Sumio Iijima & Toshinari Ichihashi, Nature 363, 603-605 (17 Jun. 1993), Wang et al., *Nano Letters* 9 (9): 3137-3141 (2009). Nanotubes are often categorized as single-walled nanotubes (SWNTs) and multi-walled nanotubes (MWNTs) depending on the number of layers of the tube.

The nature of the bonding of a nanotube is described by applied quantum chemistry, specifically, orbital hybridization. The chemical bonding of nanotubes is composed entirely of $sp^2$ bonds, similar to those of graphite. This bonding structure, which is stronger than the $sp^3$ bonds found in diamonds, provides the molecules with their unique strength. Nanotubes naturally align themselves into "ropes" held together by Van der Waals forces.

Most single-walled nanotubes (SWNT) have a diameter of close to 1 nanometer, with a tube length that can be many millions of times longer. The structure of a SWNT can be conceptualized by wrapping a one-atom-thick layer of graphite called graphene into a seamless cylinder. Single-walled nanotubes are an important variety of carbon nanotube because they exhibit electric properties that are not shared by the multi-walled carbon nanotube (MWNT) variants. In particular, their band gap can vary from zero to about 2 eV and their electrical conductivity can show metallic or semiconducting behavior, whereas MWNTs are zero-gap metals. Single-walled nanotubes are the most likely candidate for miniaturizing electronics beyond the micro electromechanical scale currently used in electronics. The most basic building block of these systems is the electric wire, and SWNTs can be excellent conductors. One useful application of SWNTs is in the development of the first intramolecular field effect transistors (FET). Production of the first intramolecular logic gate using SWNT FETs has recently become possible as well. To create a logic gate you must have both a p-FET and an n-FET. Because SWNTs are p-FETs when exposed to oxygen and n-FETs otherwise, it is possible to protect half of an SWNT from oxygen exposure, while exposing the other half to oxygen. This results in a single SWNT that acts as a NOT logic gate with both p and n-type FETs within the same molecule.

Multi-walled nanotubes (MWNT) consist of multiple rolled layers (concentric tubes) of graphite. There are two models which can be used to describe the structures of multi-walled nanotubes. In the so called "Russian Doll" model, sheets of graphite are arranged in concentric cylinders, e.g. a (0.8) single-walled nanotube (SWNT) within a larger (0.10) single-walled nanotube. In the so called "Parchment model," a single sheet of graphite is rolled in around itself, resembling a scroll of parchment or a rolled newspaper. The interlayer distance in multi-walled nanotubes is close to the distance between graphene layers in graphite, approximately 3.4 Å.

The properties of double-walled carbon nanotubes (DWNT) are similar to SWNT their resistance to chemicals can be significantly improved. This is especially important when functionalization is required (this means grafting of chemical functions at the surface of the nanotubes) to add new properties to the carbon nanotubes. In the case of SWNT, covalent functionalization will break some C=C double bonds, leaving "holes" in the structure on the nanotube and thus modifying both its mechanical and electrical properties.

Carbon nanotubes can be used in electronics applications, for example in transistors, light emitters for display, and flexible electrodes. Their possible use as electrical conductors has not been as extensively investigated. The instant disclosure demonstrates growth and patterning as well as integration of carbon nanotubes as an electrical conductor in interconnect structures. The advantages of carbon nanotube-based interconnects include high current carrying capability, no electromigration, robust mechanical properties, and high thermal conductivity.

SUMMARY OF THE INVENTION

The present disclosure relates to a structure comprising:
1. a cured polymeric fill matrix comprising at least one latent photoacid generator; and
2. a layer of patterned and cured photosensitive dielectric material (interconnect pattern) on the cured polymeric fill matrix.

The disclosure also relates to a method of patterning a photosensitive material on a polymeric fill matrix, wherein the polymeric fill matrix comprises at least one latent photoacid generator. The method comprises:
a. depositing a polymeric fill matrix comprising at least one latent photoacid generator;
b. curing the polymeric fill matrix;
c. depositing a layer of photosensitive material directly onto the cured polymeric fill matrix; and
d. forming a pattern with at least one opening in the layer of photosensitive material with lithography.

DETAILED DESCRIPTION

Figure 1:
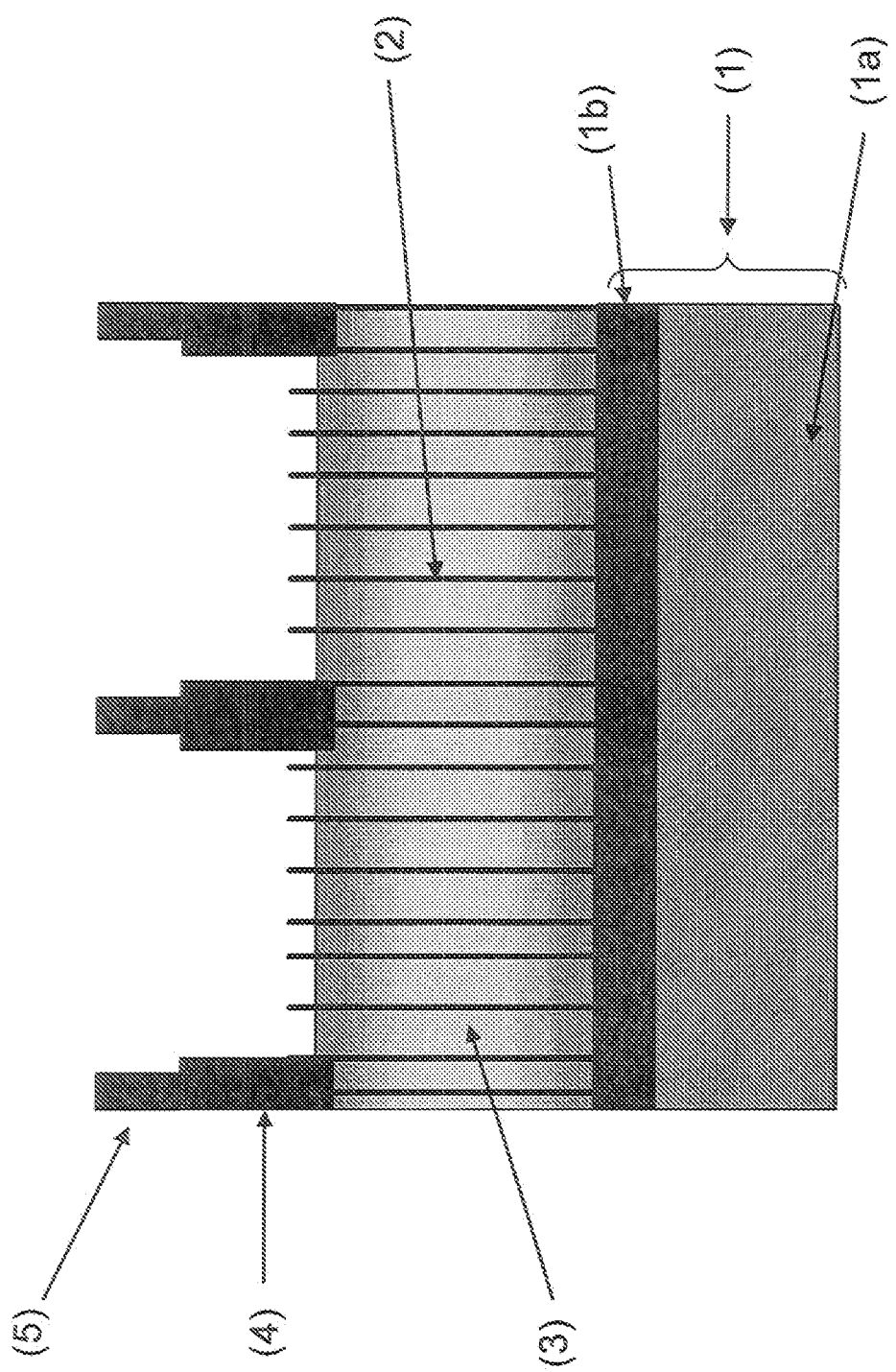
FIG. 1 is a depiction of a carbon nanotube structure according to one embodiment of the instant disclosure.

In the instant disclosure, numerous specific details are set forth, such as particular structures, components, materials, dimensions, processing steps and techniques, in order to provide a thorough understanding. However, it will be appreciated by one of ordinary skill in the art that the disclosure may be practiced without these specific details. In other instances, well-known materials, structures or processing steps have not been described in detail in order to avoid obscuring the disclosure.

It will be understood that when an element as a layer, region or substrate is referred to as being "on," "onto" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terms "comprising," "having," and "including" are used in their open, non-limiting sense.

The terms "a" and "the" are understood to encompass the plural as well as the singular.

By the term "about" when referring to a value, is meant specifically that a measurement can be rounded to the value using a standard convention for rounding numbers. For example, "about 1.5" is 1.45 to 1.54.

An "electrically conductive substrate" can be any substrate capable of conducing electricity and able to support the growth of carbon nanotubes. In one embodiment, the electrically conductive substrate comprises a semiconductive material, an electrically insulative material, an electrically conductive material, devices or structures made of these materials or any combination thereof (e.g., a lower level of an interconnect structure). When the electrically conductive substrate is comprised of a semiconducting material, any semiconductor such as Si, SiGe, SiGeC, SiC, Ge alloys, GaAs, InAs, InP and other III/V or II/VI compound semiconductors, or organic semiconductors may be used. The substrate may also be a flexible substrate containing devices that are suitable for high-speed roll-to-roll processing. In addition to these listed types of semiconducting materials, the electrically conductive substrate may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices. In some embodiments, one or more semiconductor devices such as, for example, complementary metal oxide semiconductor (CMOS) devices, strained silicon devices, carbon-based (e.g., carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated on the semiconducting material.

When the electrically conductive substrate is an electrically insulating material, the insulating material can be an organic insulator, an inorganic insulator or a combination thereof including multilayers. The electrically insulating materials may be part of a device, or devices or structures, which may be discrete or interconnected. These devices and structures may be for logic applications or memory applications.

When the electrically conductive substrate is an electrically conducting material, the substrate may include, for example, polySi, an elemental metal, an alloy including at least one elemental metal, a metal silicide, a metal nitride, carbon nanotubes, graphene or combinations thereof including multilayers.

"Carbon nanotubes" are allotropes of carbon with a cylindrical nanostructure. Nanotubes are members of the fullerene structural family. The ends of a nanotube can be capped with a hemisphere of the buckyball structure. Their name is derived from their size, since the diameter of a nanotube is on the order of a few nanometers (approximately $\frac{1}{50,000}$th of the width of a human hair), while they can be up to 18 centimeters in length. Nanotubes are categorized as single-walled nanotubes (SWNTs) and multi-walled nanotubes (MWNTs). Carbon nanotubes can be grown by a variety of techniques well known in the art. For example, carbon nanotubes can be grown by Chemical Vapor Deposition (CVD), which can include High Temperature Chemical Vapor Deposition (HTCVD), Ultra-High Vacuum Chemical Vapor Deposition (UHVCVD), Metal Organic Chemical Vapor Deposition (MOCVD), Hot Wire chemical Vapor Deposition (HTCVD), Water assisted Chemical Vapor Deposition, or combination of any thereof, Arc Discharges, Plasma Assisted Chemical Vapor Deposition (PACVD), Plasma Enhanced Chemical Vapor Deposition (PECVD), Laser Ablation, and a combination thereof.

The "polymeric fill matrix" is deposited onto a conductive substrate having carbon nanotubes grown thereon. It fills the gap around the carbon nanotubes. The polymeric fill matrix is generally a non-conductive substance with insulator properties.

The polymer fill matrix typically comprises a polymer or a copolymer, or a blend of two or more polymers and/or copolymers ("collectively referred to as "polymers"). Examples of these polymers are described in U.S. Pat. No. 7,709,177, which is incorporated herein by reference in its entirety. These polymers are typically phase compatible, soluble in conventional casting solvents, and able to form high integrity, planarizing films. The polymers typically comprise a covalently bonded "chromophore" that can be used as a means of modulating the optical properties of the material and a variety of wavelengths. For example, a poly(hydroxystyrene) (PHS) based polymer that contains some portion of the aromatic rings with a substituent anthracenylmethyl or napthalene group allows for n & k modulation at 248 nm. This functional group can be incorporated into the polymer structure either by direct copolymerization or by starting with a desired polymer platform (i.e. PHS) and attaching the moiety by acid catalyzed electrophilic aromatic substitution/condensation with anthracenemethanol.

In one embodiment, the polymeric fill matrix comprises a polyhydroxystyrene based polymer containing aromatic rings, wherein some portion of the aromatic rings contain anthracenylmethyl or naphthalene groups. In another embodiment, the polymeric fill matrix comprises a blend of poly(4-hydroxystyrene) and 9-anthracenylmethylated poly (hydroxy styrene). In another embodiment, the blend comprises tetrahydro-1,3,4,6-tetrakis(methoxymethyl)-imidazo[4,5-d]imidazole-2,5-(1H,3H)-dione and p-nitrobenzyltosylate.

The optical properties (n and k) at 248 nm can be tuned by controlling the degree of substitution of this functional group. The optical properties can be further modified by the inclusion of other compatible polymer of differing optical properties into the aforementioned blend. For example, unsubstituted PHS can be blended with anthacenemethylated PHS to derive a blend with the desired optical properties. These polymers, being aromatic in nature, have a high carbon to hydrogen ratio and are thus consistent with materials that targeted for use in etch resistance applications. The addition of grafted fused-polycyclic aromatic groups, such as anthracene, add to the etch resistance properties of these copolymers.

These polymers may be rendered insoluble by an acid catalyzed reaction of an added crosslinking molecule with the polymeric matrix. The thermally generated acid is provided by a thermal acid generator (TAG) species. The crosslinking species is one of a number of previously reported (Q. Lin, SPIE Proceedings Vol. 3049 974-987 (1997) polyfunctional species that can react with the phenolic sites of a polymer such as PHS or anthracenemethylated PHS, which is incorporated herein by reference in its entirety. Compounds which are suitable for this application include species based on mono, di, or multi hydroxy substituted methylphenols and derivatives as described in U.S. Pat. No. 5,296,332 and amino plasts as described in U.S. Pat. No. 5,212,046, based on urea or glycoluril resins commercially available from American Cyanamid, melamines, TAGs are chosen from the class of compounds that undergo catastrophic decomposition at a given threshold temperature that results in the formation of one or more molecules of a strong acid.

Other materials that can be used as polymeric fill matrix include polyarylsulfones such as the BARL material, polyhydroxystyrene based derivatives, an example being a copolymer of polyhydroxystyrene and polyhydroxystyrene reacted with anthracenemethanol that contains a cross-linker, and acid catalyst (thermal acid generator), polyimides, polyethers in particular polyarylene ethers, polyarylenesulfides, polycarbonates such as polyarylenecarbonates, epoxies, epoxyacrylates, polyarylenes such as polyphenylenes, polyarylenevinylenes such as polyphenylenevinylenes, polyvinylcarbazole, cyclicolefins, polyesters.

The optical, chemical, and physical properties of the polymeric fill matrix are appropriately tuned. For example, the optical properties such as index of refraction (n) and extinction coefficient (k) are optimized. For example, the index of refraction (n) and extinction coefficient (k) can be from about 1.45 to about 2.1 and about 0.01 to about 0.6, respectively, at 365, 248, 193 and 157 nm.

A "latent photoacid generator" is any photoacid generating compound conventionally used with photoresist compositions that generates a strong acid under heat or irradiation. Conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000), all of which are incorporated herein by reference in their entirety.

The polymeric fill matrix can be selectively etched back to expose tips of the carbon nanotubes by methods known in the art. For instance, the polymeric fill matrix can be etched back using reactive ion etching (RIE). The RIE is typically performed using inductively coupled plasma, capacitively coupled plasma, oxidizing plasma, reducing plasma, or a combination thereof. In one embodiment, the RIE is performed at a pressure of from about 1 mTorr to about 500 mTorr. The reactive ion etching is typically carried out at a cathode temperature of from about 0° C. to about 500° C. The reactive ion etching may be performed using oxidizing plasma comprising $O_2$, CO, $CO_2$, or a combination thereof. The oxidizing based plasma can further comprise Ar, $N_2$, or a combination thereof. The reactive ion etching may be performed using a reducing plasma comprising $H_2$, $NH_3$, or a combination thereof. The reducing plasma can further comprise Ar, $N_2$, or a combination thereof.

After selectively etching-back the polymeric fill matrix to expose tips of the carbon nanotubes, the remaining polymeric fill matrix embedded around the carbon nanotubes is cured. The polymeric fill matrix can be cured, for example, by heat, plasma, irradiation of electromagnetic wave such as ultraviolet (UV) light, electron beam, ion beam, microwave and the like, or combination thereof. Moveover, the polymeric fill matrix can be cured by exposure to UV-light for about 1 minute to about 60 minutes, or from about 20 minutes to about 60 minutes, or from about 30 minutes to about 60 minutes, or from about 20 minutes to about 45 minutes, or from about 30 minutes to about 45 minutes. The polymeric fill matrix can be cured using a combination of UV-light and thermal heat. For example, the polymer matrix may be heated to a temperature of from about 50° C. to about 500° C., or from about 100° C. to about 500° C., or from about 150° C. to about 450° C., or from about 200° C. to about 450° C., or from about 250° C. to about 450° C.

A photosensitive dielectric material is applied on the cured polymeric fill matrix and on of the exposed tips of the carbon nanotubes. The photosensitive dielectric material can be applied using convention deposition processes including, for example, spin-on-coating, dip coating, brush coating, and ink-jet dispensing, etc. After applying the photosensitive dielectric material, a post deposition baking step can be, but not necessarily always, used to remove unwanted components, such as solvent. When performed, the baking step is conducted at a temperature from 40° C. to 200° C., or from about 60° C. to about 140° C.

The term "photosenstive" is used throughout the application to denote imagable functional groups which undergo a chemical reaction under exposure to radiation. The photosensitive imagable functional groups may include, for example, acid-sensitive positive-tone functional groups or acid-sensitive negative-tone functional groups. The negative-tone acid-sensitive functional groups are functional groups for causing a crosslinking reaction which causes the exposed areas to be insoluble in a developer to form a negative-tone relief image after development. The positive-tone acid-sensitive functional groups are acid-sensitive protecting groups which cause the exposed region to be soluble in a developer to form positive-tone relief images after development.

The photosensitive dielectric material may be a low-k material that first acts as a photoresist during a patterning process and then acts as a low-k dielectric insulator after a post patterning cure process. The cured product of a patternable low-k material, therefore, can serve as an on-chip dielectric insulator. The terms "cure" or "curing" are used interchangeable to refer to one of the processes selected from a thermal cure, an electron beam cure, an ultra-violet (UV) cure, an ion beam cure, a plasma cure, a microwave cure or a combination thereof. A "cured" product of a patternable low-k material is the product of the patternable low-k material after it has undergone one of the aforementioned cure processes. The "cured" product of a patternable low-k material is different from the patternable low-k material in chemical nature and physical, mechanical and electrical properties.

The patternable low-k material can function as a photoresist and is converted into a low-k material during post patterning processing, by heat, UV light, electron beam, ion beam, microwave, plasma cure, thermal cure or combinations thereof. For instance, the patternable low-k material may comprise a functionalized polymer, copolymer, or a blend including at least two of any combination of polymers and/or copolymers having one or more acid-sensitive imagable groups. These polymers, copolymers or blends can be converted into low-k polymers after subsequent processing.

In general terms, the patternable low-k material that can be a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the patternable low-k material comprises a photo/acid-sensitive polymer of one monomer or a copolymer of at least two monomers selected from hydrocarbons, fluorinated hydrocarbons, siloxane, silane, carbosilane, oxycarbosilane, organosilicates, silsesquioxanes and the like. The patternable low-k material may also comprise a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the patternable low-k dielectric material may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally the patternable low-k material may comprise at least one microscopic pore generator (porogen). The pore generator may be or may not be photo/acid sensitive. By "photo/acid sensitive": it means that this porogen is sensitive to light and/or acid such that the porogen itself is patternable or enhances the resolution and/or the pattern quality of the patternable low-k material. This pore generator has these attributes: (1) is compatible with the other components of the patternable low-k composition, i.e., without phase separation after coating and other processing; (2) can be patterned with standard lithographic techniques as part of the patternable low-k composition; and (3) can be removed during the post patterning cure process to generate microscopic pores, thus lowering the dielectric constant of the cured patternable low-k material. The pore size (diameter) is typically less than 10 nm, less than 5 nm, or less than 2 nm.

Illustrative polymers for the patternable low-k material include, but are not limited to, siloxane, silane, carbosilane, oxycarbosilane, silsesquioxanes-type polymers including caged, linear, branched or combinations thereof. In one embodiment, the patternable dielectric material comprises a blend of these photo/acid-sensitive polymers. Examples of patternable low-k materials useable with the present disclosure are disclosed in U.S. Pat. Nos. 7,041,748, 7,056,840, and 6,087,064, as well as U.S. Ser. Nos. 11/750,356, filed May 18, 2007, now U.S. Patent Application Publication Nos. 2008/0286467, 12/047,435, filed Mar. 13, 2008, and 12/126,287, filed May 23, 2008 all of which are incorporated herein by reference in their entirety. The dielectric constant of the patternable low-k material after cure is generally no more than 4.3. The dielectric constant may be greater than 1 and up to 4.3, from 1 to 3.6, from 1 to 3.0, from 1 to 2.5, or from 1 to 2.0.

When the patternable low-k material is a negative-tone patternable low-k material, it may be formed from a composition optionally including an additional cross-linker. This additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the patternable low-k material is a positive-tone patternable low-k material, it is formed from a composition that includes one of the above mentioned polymers, copolymers or blends, a photoacid generator, a base additive and a solvent typically used in a photoresists. The photoacid generators, base additives and solvents are well known to those skilled in the art and, as such, details regarding those components are not fully provided.

In one embodiment, the patternable low-k material is a chemically amplified positive-tone or negative-tone patternable low-k material that comprises a silsesquioxane polymer or copolymer or a blend of at least two of any combination of polymers and/or copolymers. This photo/acid sensitive silsesquioxane polymer or copolymer may undergo a photo/acid catalyzed chemical transformation to form circuit patterns after lithographic patterning. When the patternable low-k material is a chemically amplified positive-tone patternable low-k material, it typically undergoes a de-protection reaction to render the exposed area soluble in a developer; when the patternable low-k material is a chemically amplified negative-tone patternable low-k material, it typically undergoes a cross-linking reaction (to itself or through an additional cross-linker) to render it insoluble in a developer in the exposed regions during lithographic processing. Therefore, integrated circuit patterns can be generated during standard semiconductor lithography process. Furthermore, these integrated circuit patterns maintain their pattern integrity during the post patterning cure process to convert the patternable low-k material from a resist into a low-k material. Examples of such photo/acid sensitive silsesquioxane polymers or copolymers include poly(methylsilsesquioxane) (PMS), poly(p-hydroxybenzylsilsesquioxane) (PHBS), poly(p-hydroxyphenylethylsilsesquioxane)(PHPES), poly(p-hydroxyphenylethylsilsesquioxane-co-p-hydroxy-alpha-methylbenzyl silsesquioxane) (PHPE/HMBS), poly(p-hydroxyphenylethylsilsesquioxane-co-methoxybenzylsilsesquioxane) (PHPE/MBS), poly(p-hydroxyphenylethylsilsesquioxane-co-t-butylsilsesquioxane) (PHPE/BS), poly(p-hydroxyphenylethylsilsesquioxane-co-cyclohexylsilsesquioxane) (PHPE/CHS), poly(p-hydroxyphenylethylsilsesquioxane-co-phenylsilsesquioxane) (PHPE/PS), poly(p-hydroxyphenylethylsilsesquioxane-co-bicycloheptylsilsesquioxane) (PHPE/BHS), polyp-hydroxy-alpha-methylbenzylsilsesquioxane) (PHMBS), polyp-hydroxy-alpha-methylbenzylsilsesquioxane-co-p-hydroxybenzylsilsesquioxane) (PHMB/HBS), poly(p-hydroxy-alpha-methylbenzylsilsesquioxane-co-methoxybenzylsilsesquioxane) (PHMB/MBS), poly(p-hydroxy-alpha-methylbenzylsilsesquioxane-co-t-butylsilsesquioxane) (PHMB/BS), poly(p-hydroxy-alpha-methylbenzylsilsesquioxane-co-cyclohexylsilsesquioxane) (PHMB/CHS), poly(p-hydroxy-alpha-methylbenzylsilsesquioxane-co-phenylsilsesquioxane) (PHMB/PS), poly(p-hydroxy-alpha-methylbenzylsilsesquioxane-co-bicycloheptylsilsesquioxane) (PHMB/BHS), poly(p-hydroxybenzylsilsesquioxane-co-p-hydroxyphenylethylsilsesquioxane) (PHB/HPES), and poly(p-hydroxy-alpha-methylbenzylsilsesquioxane-co-p-alpha-methylbenzylsilsesquioxane) (PHMB/MBS). In one embodiment, the patternable low-k dielectric material is a copolymer of at least two monomers selected from an alkyltrialkoxysilane and/or a tetra-alkoxysilane. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer.

In another embodiment, the patternable low-k dielectric material comprises a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

In one embodiment, the patternable low-k material comprises a silsesquioxane polymer. It may be linear, branched, caged compound or combinations thereof having the following general structural formula:

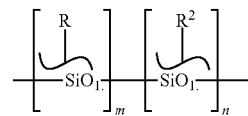

where, m and n represent the number of repeating units, $R^1$ represents a group which may comprise one or more functional groups which may provide polymer solubility in an aqueous base and provide functional groups for cross-linking, and $R^2$ represents a group which may comprise a carbon functionality which may control polymer dissolution rate in an aqueous base. Subscripts m and n may be integers in the range from 0 to 5000, such as 1 to 5000 for example. $R^1$ may not be the same as $R^2$.

$R^1$ is not limited to any specific functional group, and may comprise functional groups which are substituted with —OH groups, —C(O)OH groups, —F, or combinations thereof. $R^1$ may comprise linear or branched alkyls, cycloalkyls, aromatics, arenes, or acrylics. For example, $R^1$ may be:

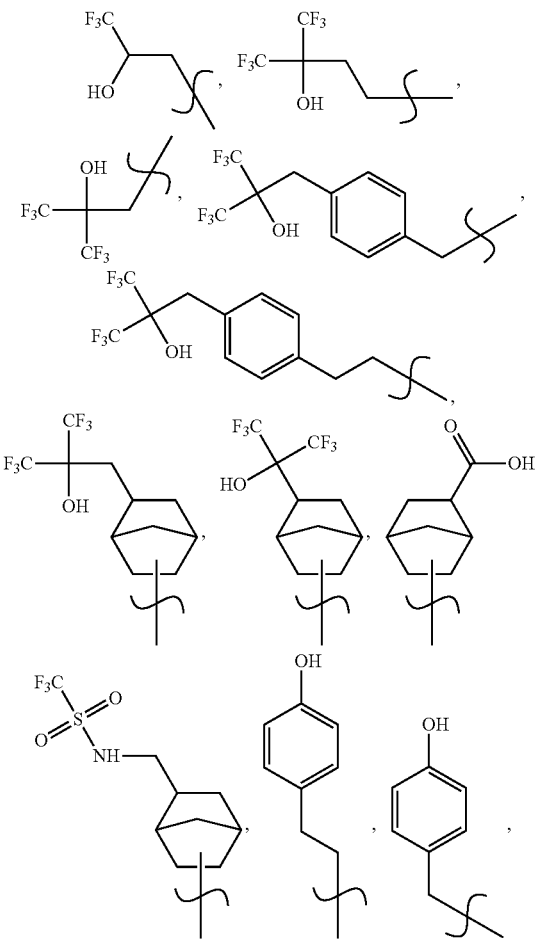

-continued

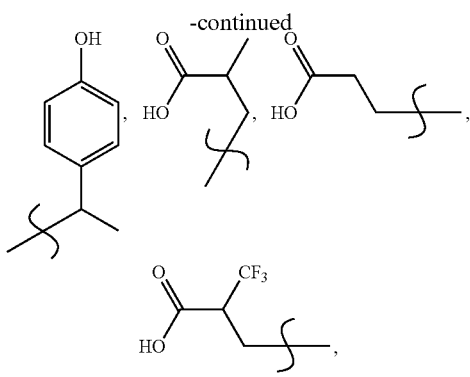

or the like.

R² is not necessarily limited to any specific functional group, and may comprise hydrogen, or linear or branched alkyls, cycloalkyls, aromatics, arenes, acrylates, or combinations thereof. For example R² may be:

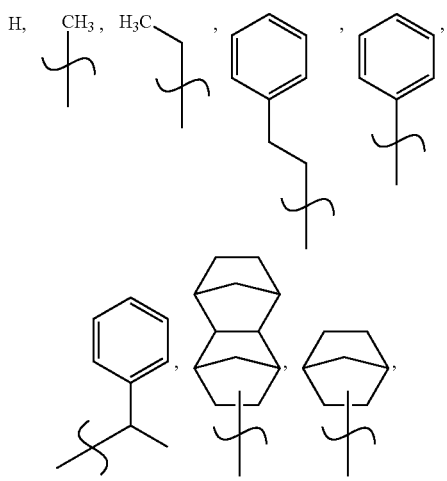

or the like.

The R¹ and R² proportions and structures may be selected to provide a material suitable for photolithographic patterning processes.

In one embodiment, the patternable low-k dielectric material is a negative-tone patternable low-k dielectric material comprising a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. The polymers in the blend may be miscible with each other.

In some instances, the second polymer of the polymer blend of this embodiment may comprise a polymer of one monomer or a copolymer including at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. In one embodiment, the second polymer of the polymer blend may comprise a copolymer at least two monomers selected from siloxane, silane, silsesquioxane, carbosilane, or oxycarbosilane moieties. In another embodiment of the present disclosure, the second polymer of the polymer blend may comprise a copolymer of at least two monomers selected from an alkyltrialkoxysilane and/or a tetra-alkoxysilane. The molar ratio of the alkyltrialkoxysilane monomer in the copolymer ranges from 0 to 100%. The weight average molecular weight of the copolymer range from 100-5,000,000 g/mol, or 500-50,000 g/mol. In one embodiment, the copolymers derived from at least two monomers are selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer. In one embodiment, the second polymer of the polymer blend is a copolymer of methylsilsesquioxane and tetra-alkoxysilane.

In another embodiment, the second polymer of the polymer blend is a silsesquioxane polymer comprising a polymer having the structural formula:

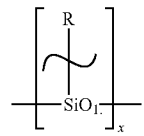

wherein R³ may be a functional group comprising alkyls, cycloalkyls, aryl, or combinations thereof, and wherein x represents the number of repeating units and may be an integer in a range from 4 to 50000. For example, R³ may be:

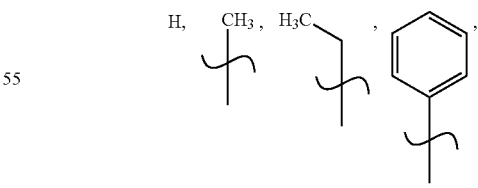

or the like.

In one embodiment, the polysilsesquioxane may be poly(methylsilsesquioxane), where R³ is a methyl group, and x is an integer from 10 to 1,000. In other embodiments, x may be greater than 1,000. The polysilsesquioxane may also comprise a copolymer with siloxane, silane, carbosilane, oxycarbosilane, alkyltrialkoxysilane, or tetra-alkoxysilane. The polysilsesquioxane structure may be caged, linear, branched, or a combination thereof. The silsesquioxane polymers described herein may comprise end groups comprising silanols, halosilanes, acetoxysilanes, silylamines, alkoxysilanes, or combinations thereof, which may undergo condensation reactions in the presence of an acid (such as an acid generated by a photoacid generator under exposure to radiation), followed by thermal baking. Polymer molecules of the polysilsesquioxane may undergo chemical crosslinking with the first polymer or copolymer of the polymer blend, the second polysilsesquioxane polymer or copolymer in the polymer blend itself, or a combination of these.

In one embodiment, the polysilsesquioxane may be the silsesquioxane copolymer LKD-2056 or LKD2064 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

The second silsesquioxane polymers or copolymers in the polymer blend may have a weight averaged molecular weight in the range from 200 to 5,000,000 g/mol, such as from 1500 to 10,000 g/mol, for example.

In another embodiment, the patternable low-k dielectric material is a negative-tone patternable low-k material comprising a carbosilane-substituted silsesquioxane polymer that may be a linear, branched, caged compound or a combination thereof, having the following general structural formula:

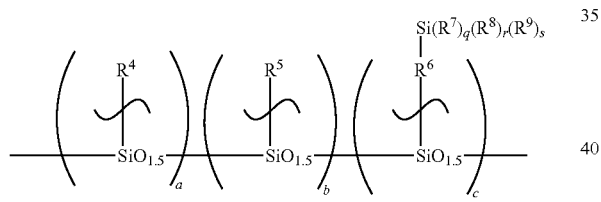

where, a, b, and c represent the number of each of the repeating units, $R^4$, $R^5$, $R^6$, $R^7$, and $R^8$ are carbon-containing groups, and $R^9$ is an alkoxy group. $R^6$, $R^7$ and $R^8$ may each independently represent a hydrocarbon group comprising 1 to 6 carbon atoms.

$R^4$, $R^5$, $R^6$, $R^7$, $R^8$, $R^9$ may be non-identical groups. Subscripts a, b, and c represent the number of repeating units in the polymer chain. Subscripts q and r may be integers in a range from 0 to 3. Subscript s may be an integer in a range from 1 to 3. Subscripts a and c may be integers greater than zero. For example a and c may each independently be in a range from 1 to 5,000. Subscript b may be an integer greater than or equal to zero. For example, b may be an integer in a range from 0 to 5,000.

$R^4$ may represent a group which comprises one or more functional groups which provide polymer solubility in an aqueous base and functional groups for a cross-linking reaction. Each instance of $R^4$ is not limited to any specific functional group, and may comprise a functional group which is substituted with one or more —OH groups, —C(O)OH groups, —F, or combinations thereof. $R^4$ may comprise linear or branched alkyls, cycloalkyls, aromatics, arenes, or acrylics. Examples of $R^4$ include:

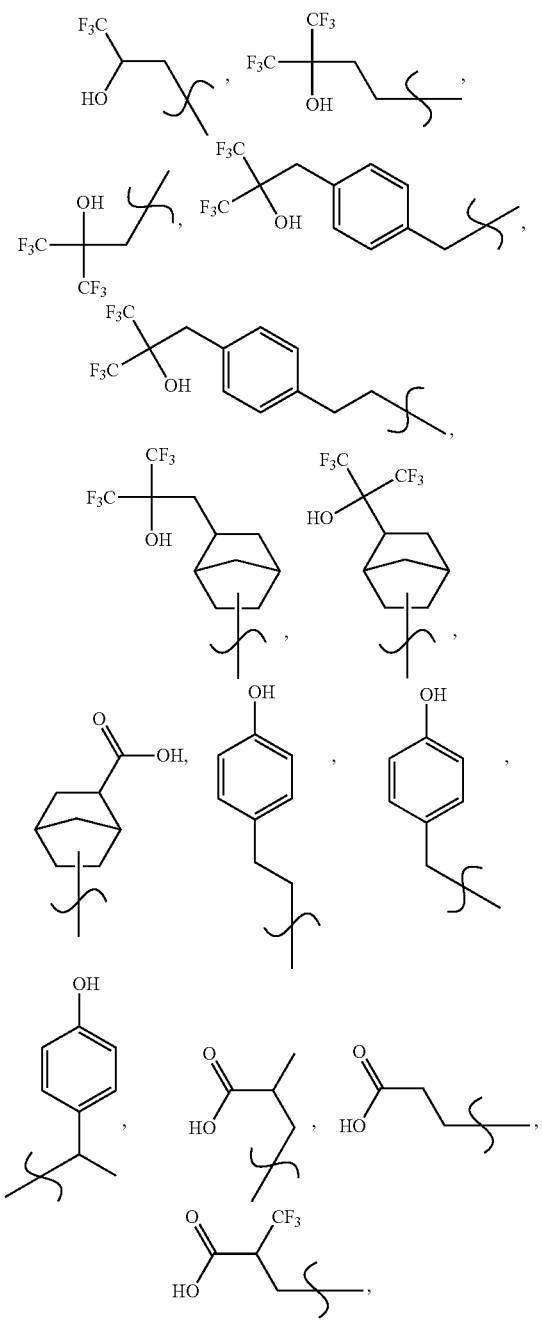

or the like.

$R^5$ may represent a group which comprises a carbon functionality comprising at least one carbon atom, where the carbon functionality controls polymer dissolution of the polymer into an aqueous base. The structure (e.g., size, chain length, etc.) of $R^5$ may affect the dissolution rate of the polymer into an aqueous base. Balancing of the dissolution-controlling group, $R^5$, with the solubility and cross-linking controlling group, $R^4$, allows properties such as dissolution rate and aqueous base solubility to be appropriately adjusted. $R^5$ is not necessarily limited to any specific functional group, and may comprise linear or branched alkyls, cycloalkyls, aromatics, arenes, acrylates, or combinations thereof. Examples of $R^5$ include:

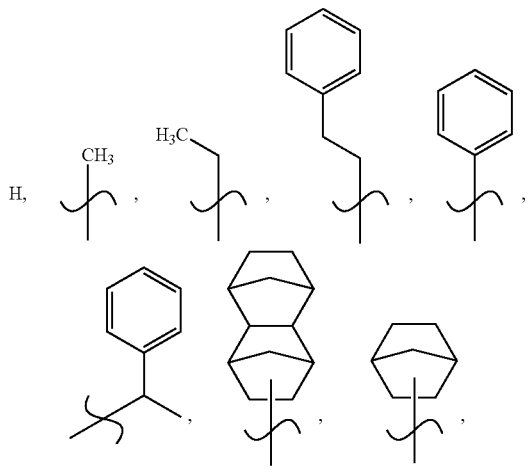

or the like.

R⁶ is not limited to any specific alkoxy group. Examples of R⁶ include linear or branched alkoxys, cycloalkoxy, and acetoxy groups.

The specific proportions and structures of $R^4$, $R^5$, and $R^6$ may be selected to provide a material suitable for photolithographic patterning processes.

In another embodiment, the patternable low-k material is a negative-tone patternable low-k material comprising a polymer blend of a first polymer or copolymer and a second polymer or copolymer wherein the first polymer is the carbosilane-substituted silsesquioxane polymer described above and the second polymer is polymer of one monomer or a copolymer of at least two monomers selected from siloxane, silane, silsesquioxane, carbosilane, or oxycarbosilane moieties. In one embodiment of the present disclosure, the second polymer of the polymer blend may comprise a copolymer of at least two monomers selected from an alkyltrialkoxysilane and/or a tetra-alkoxysilane. The molar ratio of the alkyltrialkoxysilane monomer in the copolymer ranges from 0 to 100%. The weight average molecular weight of the copolymer range from 100-5,000,000 g/mol, or from 500-50,000 g/mol. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer. In one embodiment, the second polymer of the polymer blend is a copolymer of methylsilsesquioxane and tetra-alkoxysilane.

In another embodiment, the negative-tone carbosilane-substituted silsesquioxane patternable low-k composition may be a polymer blend of a first polymer and a second polymer wherein the first polymer is the carbosilane-substituted silsesquioxane polymer described above and the second polymer of the polymer blend is a silsesquioxane polymer comprising a polymer having the structural formula:

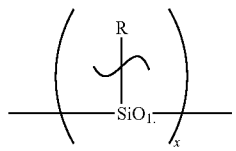

wherein $R^3$ may be a functional group comprising alkyls, cycloalkyls, aryl, or combinations thereof, and wherein x represents the number of repeating units and may be an integer in a range from 4 to 50000. For example, $R^3$ may be:

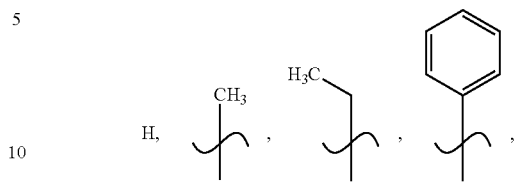

or the like.

In one embodiment, the polysilsesquioxane may be poly(methylsilsesquioxane), where $R^3$ is a methyl group, and x is an integer from 10 to 1,000. In other embodiments, x may be greater than 1,000. The polysilsesquioxane may also comprise a copolymer with siloxane, silane, carbosilane, oxycarbosilane, alkyltrialkoxysilane, or tetra-alkoxysilane. The polysilsesquioxane structure may be caged, linear, branched, or a combination thereof. The silsesquioxane polymers or copolymers described herein may comprise end groups comprising silanols, halosilanes, acetoxysilanes, silylamines, alkoxysilanes, or combinations thereof, which may undergo condensation reactions in the presence of an acid (such as an acid generated by a photoacid generator under exposure to radiation), followed by thermal baking. Polymer molecules of the polysilsesquioxane may undergo chemical crosslinking with the first polymer or copolymer of the polymer blend, the second polysilsesquioxane polymer or copolymer in the polymer blend itself, or a combination of these. In one embodiment, the polysilsesquioxane may be the silsesquioxane copolymer LKD-2056 or LKD2064 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

The silsesquioxane polymers representing the second polymer of the polymer blend described for this embodiment may have a weight averaged molecular weight in the range from 200 grams/mole (g/mol) to 500,000 g/mol, such as from 1500 g/mol to 10,000 g/mol, for example.

In another embodiment, compositions containing a blend of at least two of any combination of a silsesquioxane polymer and/or a silsesquioxane copolymer are employed. The silsesquioxane polymer or copolymer in the blend may be selected from the silsesquioxane polymers or copolymers described above or may be selected from other silsesquioxane polymers or copolymers such as, for example, poly(methylsilsesquioxane) (PMS), poly(p-hydroxybenzylsilsesquioxane) (PHBS), poly(p-hydroxybenzylsilsesquioxane-co-methoxybenzylsilsesquioxane) (PHB/MBS), polyphydroxy-alpha-methylbenzylsilsesquioxane-co-p-alpha-methylbenzylsilsesquioxane) (PHMB/MBS), poly(p-hydroxybenzylsilsesquioxane-co-t-butylsilsesquioxane) (PHB/BS), poly(p-hydroxybenzylsilsesquioxane-co-cyclohexylsilsesquioxane) (PHB/CHS), poly(p-hydrooxybenzylsilsesquioxane-co-phenylsilsesquioxane) (PHB/PS), poly(p-hydroxybenzylsilsesquioxane-co-bicycloheptylsilsesquioxane) (PHB/BHS), and caged silsesquioxanes such as octakis(glycidyloxypropyl)dimethylsilyloxy)silsesquioxane, octakis[cyclohexenyl epoxide)

dimethylsilyloxy]silsesquioxane, octakis[4-(hydroxyphenylethyl) dimethylsilyloxy]silsesquioxane, and octakis[{2-(1',1'-bis(trifluoromethyl)-1'-hydroxyethyl) norbornyl}dimethylsilyloxy]silsesquioxane. If desired, a combination of different Si-containing polymers may be used in the blend with the non-Si-containing polymers, such as a pore generator.

In yet another embodiment, the patternable low-k dielectric material comprises a copolymer of at least two monomers selected from an alkyltrialkoxysilane and/or a tetra-alkoxysilane. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer.

In a another embodiment for negative-tone patternable low-k materials two miscible, or compatible, silsesquioxanes are employed. The first silsesquioxane polymer or copolymer is a linear, branched, caged compound or combination thereof having the following structural formula:

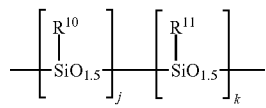

wherein each occurrence of $R^{10}$ is one or more acidic functional groups for base solubility and provides functional groups for cross-linking; each occurrence of $R^{11}$ is a carbon functionality for controlling polymer dissolution rate in an aqueous base; $R^{10}$ is not equal to $R^{11}$; j and k represent the number of repeating units; j is an integer; and k is zero or an integer greater than zero.

In the present disclosure, $R^{10}$ is not limited to any specific functional group, and may be selected from among linear or branched alkyls which are substituted with OH, C(O)OH, and/or F; cycloalkyls which are substituted with OH, C(O)OH, and/or F; aromatics which are substituted with OH, C(O)OH, and/or F; arenes that are substituted with OH, C(O)OH, and/or F; and acrylics which are substituted with OH, C(O)OH, and/or F. Examples of preferred $R^{10}$ include:

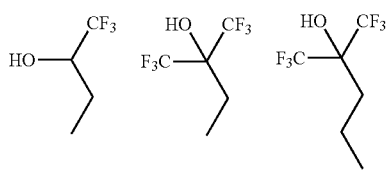

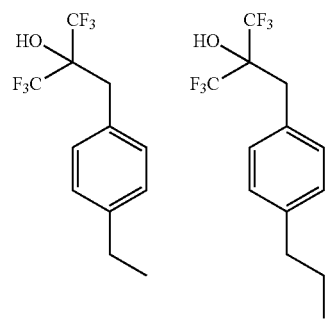

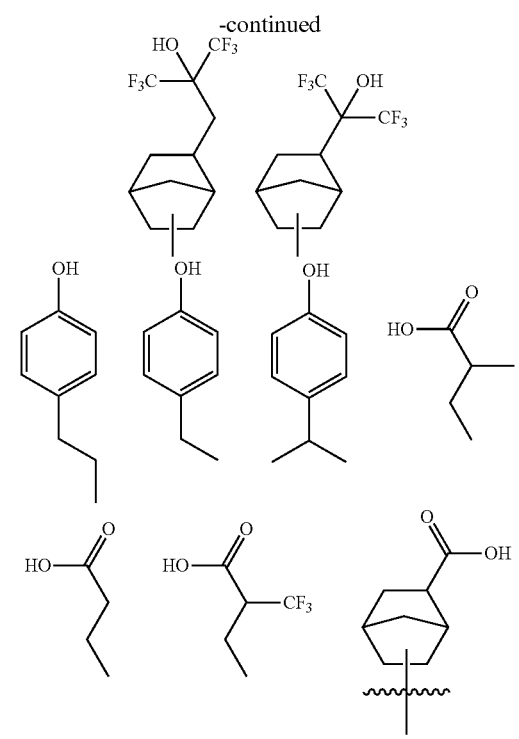

In the present disclosure, $R^{11}$ is not limited to any specific carbon functional group, and is can be selected from among linear or branched alkyls, cycloalkyls, aromatics, arenes, and acrylates.

The silsesquioxane polymers or copolymers of this embodiment have a weight averaged molecular weight of 400 to 500,000, or from 1500 to 10,000. The $R^{10}$ and $R^{11}$ proportions and structures are selected to provide a material suitable for photolithographic processes.

A second polymer component of the blend material includes but is not limited to a family of organosilicates known as silsesquioxanes having the structural formula:

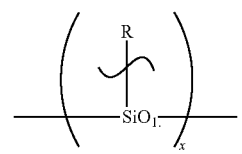

wherein $R^3$ may be a functional group comprising alkyls, cycloalkyls, aryl, or combinations thereof, and wherein x represents the number of repeating units and may be an integer in a range from 4 to 50000. For example, $R^3$ may be:

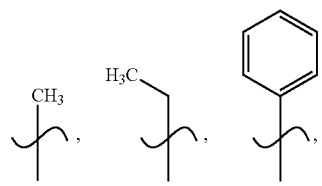

or the like.

In one embodiment, the polysilsesquioxane may be poly (methylsilsesquioxane), where $R^3$ is a methyl group, and x is an integer from 10 to 1,000. In other embodiments, x may be greater than 1,000. The polysilsesquioxane may also comprise a copolymer with siloxane, silane, carbosilane, oxycarbosilane, alkyltrialkoxysilane, or tetra-alkoxysilane. The polysilsesquioxane structure may be caged, linear, branched, or a combination thereof. The silsesquioxane polymers or copolymers described herein may comprise end groups comprising silanols, halosilanes, acetoxysilanes, silylamines, alkoxysilanes, or combinations thereof, which may undergo condensation reactions in the presence of an acid (such as an acid generated by a photoacid generator under exposure to radiation), followed by thermal baking. Polymer molecules of the polysilsesquioxane may undergo chemical crosslinking with the first polymer or copolymer of the polymer blend, the second polysilsesquioxane polymer or copolymer in the polymer blend itself, or a combination of these. In one embodiment, the polysilsesquioxane may be the silsesquioxane copolymer LKD-2056 or LKD2064 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

A third component of a negative-tone patternable low-k composition is a photosensitive acid generator (PAG). Examples of preferred PAGs include: -(trifluoro-methylsulfonyloxy)-bicyclo[2.2.1]hept-5-ene-2,3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,371,605. The content of the '605 patent is incorporated herein by reference. A weaker acid generated from a PAG such as N-hydroxy-naphthalimide (DDSN) may be used. Combinations of PAGs may be used.

The composition of the silsesquioxane polymers or copolymers in the blend formulation is 1 to 99% of the total polymer composition. In a preferred embodiment, the composition of the acid sensitive polymer is 20 to 80% of the total polymer composition, and even more preferred, 30 to 60%.

Condensation in the presence of an acid generated by a photoacid generator under exposure to radiation is not limited to silanols, but may also include halosilanes, acetoxysilanes, silylamines, and alkoxysilanes. Organic crosslinking agents, such as methylphenyltetramethoxymethyl glycouril (methylphenyl powderlink), may also be included in the formulation. Although photoacid generators are preferred for crosslinking, photobase generators can also be used for crosslinking silanol polymers or copolymers.

The patternable low-k material also typically includes a casting solvent to dissolve the other components. Examples of suitable casting solvent include but are not limited to ethoxyethylpropionate (EEP), a combination of EEP and γ-butyrolactone, propylene-glycol monomethylether alcohol and acetate, propyleneglycol monopropyl alcohol and acetate, and ethyl lactate. Combinations of these solvents may also be used.

In optimizing the photolithography process, an organic base may be added to the formulation. The base employed in the present disclosure may be any suitable base known in the resist art. Examples of bases include tetraalkylammonium hydroxides, cetyltrimethylammonium hydroxide, and 1,8-diaminonaphthalene. The compositions are not limited to any specific selection of base.

In yet another embodiment, the patternable low-k material is a chemically amplified positive-tone patternable low-k material comprising a silicon-containing polymer. The silicon-containing polymer may be a homopolymer or a copolymer. Suitable types of such silicon-containing polymers include a polymer, a copolymer, a blend including at least two of any combination of polymers and/or copolymers, wherein said polymers include one monomer and said copolymers include at least two monomers and wherein said monomers of said polymers and said monomers of said copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Highly preferred silicon-backbone polymers are selected from the group consisting of poly(hydroxyphenyl alkyl)silsesquioxanes and poly (hydroxyphenyl alkyl)siloxanes, wherein the alkyl is a $C_{1-30}$ moiety. These preferred silicon-containing polymers are sometimes fully or partially protected with acid-sensitive protecting groups.

Where the silicon-containing polymeric additive contains a silicon-containing substituent bonded to the polymeric backbone, the silicon-containing polymeric additive may be a homopolymer or copolymer containing at least one monomer having a silicon-containing substituent. The silicon-containing substituent may or may not be acid sensitive. Typically, however the substituent is acid sensitive when containing a $C_2$ alkyl moiety. In one embodiment, the silicon-containing substituent is attached to a monomer selected from the group consisting of hydroxystyrene, an acrylate, a methacrylate, an acrylamide, a methacrylamide, itaconate, an itaconic half ester or a cycloolefin. Preferred silicon-containing substituents include: siloxane, silane and cubic silsesquioxanes. The silicon-containing polymer may further include silicon-free monomers such as those selected from the group consisting of styrene, hydroxystyrene, acrylic acid, methacrylic acid, itaconic acid and an anhydride such as maleic anhydride and itaconic anhydride.

Preferred monomers containing silicon-containing substituents are trimethylsilyl alkyl acrylate, trimethylsilyl alkyl methacrylate, trimethylsilyl alkyl itaconate, tris(trimethylsilyl)silyl alkyl acrylate tris(trimethylsilyl)silyl alkyl methacrylate, tris(trimethylsilyl)silyl alkyl itaconate, tris(trimethylsilyloxy)silyl alkyl acrylate, tris(trimethylsilyloxy)silyl alkyl methacrylate, tris(trimethylsilyloxy)silyl alkyl itaconate, alkylsilyl styrene, trimethylsilylmethyl(dimethoxy)silyloxy alkyl acrylate, trimethylsilylmethyl(dimethoxy)silyloxy alkyl methacrylate, trimethylsilylmethyl(dimethoxy)silyloxy alkyl itaconate, trimethylsilyl alkyl norbornene-5-carboxylate alkyl, tris(trimethylsilyl)silyl alkyl norbornene-5-carboxylate and tris(trimethylsilyloxy)silyl alkyl norbornene-5-carboxylate, wherein alkyl is a $C_{1-5}$ moiety.

Highly preferred species of these monomers are 3-(3,5,7,9,11,13,15-heptacyclopentylpentacyclo[9.5.1.13,9.15,15.17,13]-octasiloxan-1-yl)propyl methacrylate, 1,3,5,7,9,11,13-heptacyclopentyl-15-vinylpentacyclo[9.5.1.13,9.15,15.17,13]octasiloxane, methacrylamidotrimethylsilane, O-(methacryloxyethyl)-N-(triethoxysilylpropyl)urethane, methacryloxyethoxytrimethylsilane, N-(3-methacryloxy-2- hydroxypropyl)-3-aminopropyltriethoxysilane, (methacryloxymethyl)bis(trimethylsiloxy)methylsilane, (m,p-vinylbenzyloxy)trimethylsilane, methacryloxypropyltris(trimethylsiloxy)silane, methacryloxytrimethylsilane, 3-methacryloxypropylbis(trimethylsiloxy)methylsilane, 3-methacryloxypropyldimethylchlorosilane, methacryloxypropyldimethylethoxysilane, methacryloxypropyldimethylmethoxysilane, methacryloxypropylheptacyclopentyl-T8-silsesquioxane, methacryloxypropylmethyldichlorosilane, methacryloxypropylmethyldiethoxysilane, methacryloxypropylmethyldimethoxysilane, (methacryloxymethyl)dimethylethoxysilane, (methacryloxymethyl)phenyldimethylsilane(phenyldimethylsilyl)methylmethacrylate, methacryloxymethyltriethoxysilane, methacryloxymethyltrimethoxysilane, methacryloxymethyltris(trimethylsiloxy)silane, O-methacryloxy(polyethyleneoxy)trimethylsilane, methacryloxypropylpentamethyldisiloxane, methacryloxypropylsilatrane, methacryloxypropylsiloxane macromer, methacryloxypropyl terminated polydimethylsiloxane, methacryloxypropyltrichlorosilane, methacryloxypropyltriethoxysilane, methacryloxypropyltrimethoxysilane, methacryloxypropyltris(methoxyethoxy)silane, p-(t-butyldimethylsiloxy)styrene, butenyltriethoxysilane, 3-butenyltrimethylsilane, (3-acryloxypropyl)trimethoxysilane, (3-acryloxypropyl)tris(trimethylsiloxy)silane, O-(trimethylsilyl)acrylate, 2-trimethylsiloxyethlacrylate, N-(3-acryloxy-2-hydroxypropyl)-3-aminopropyltriethoxysilane, (3-acryloxypropyl)dimethylmethoxysilane, (3-acryloxypropyl)methylbis(trimethylsiloxy)silane, (3-acryloxypropyl)methyldichlorosilane, and (3-acryloxypropyl)methyldimethoxysilane, (3-acryloxypropyl)trichlorosilane.

The extent of protection and the amount of co-monomer present in the silicon containing polymeric additive are such that the patternable low-k material resist composition will provide good lithography performance, i.e., high resolution and good process window. It should also maintain pattern integrity after post cure processing patterning. Examples of protecting groups which can be employed are cyclic and branched (secondary and tertiary) aliphatic carbonyls, esters or ethers containing from 3 to 30 carbon atoms, acetals, ketals and aliphatic silylethers.

Examples of cyclic or branched aliphatic carbonyls that may be employed in the present disclosure include, but are not limited to: phenolic carbonates; t-alkoxycarbonyloxys such as t-butoxycarbonyloxy and isopropyloxycarbonyloxy. A highly preferred carbonate is t-butoxycarbonyloxy.

Some examples of cyclic and branched ethers that may be employed in the present disclosure include, but are not limited to benzyl ether and t-alkyl ethers such t-butyl ether. Of the aforesaid ethers, it is highly preferred to use t-butyl ether.

Examples of cyclic and branched esters that can be employed are carboxylic esters having a cyclic or branched aliphatic substituent such as t-butyl ester, isobornyl ester, 2-methyl-2-admantyl ester, benzyl ester, 3-oxocyclohexanyl ester, dimethylpropylmethyl ester, mevalonic lactonyl ester, 3-hydroxy-g-butyrolactonyl ester, 3-methyl-g-butylrolactonyl ester, bis(trimethylsilyl)isopropyl ester, trimethylsilylethyl ester, tris(trimethylsilyl)silylethyl ester and cumyl ester.

Some examples of acetals and ketals that can be employed include, but are not limited to phenolic acetals and ketals as well as tetrahydrofuranyl, tetrahydropyranyl, 2-ethoxyethyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl. Of these, it is preferred that a methoxycyclohexanyl ketal be employed.

Illustrative examples of silylethers that can be employed include, but are not limited to: trimethylsilylether, dimethylethylsilylether and dimethylpropylsilylether. Of these silylethers, it is preferred that trimethylsilylether be employed.

In one embodiment, the patternable low-k dielectric material is a positive-tone patternable low-k material comprising a polymer blend of at least two silsesquioxane polymers or copolymers. The polymers or copolymers in the blend may be miscible with each other. The first silsesquioxane polymer or copolymer may be linear, branched, caged compound or combinations thereof having the following general structural formula:

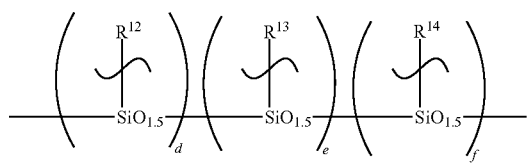

where, d, e and f represent the number of each of the repeating units, $R^{12}$ represents a carbon functionality (the carbon functionality comprising at least one carbon atom) having an acid-labile protecting group, $R^{13}$ represents a group which may comprise one or more functional groups which provide polymer solubility in aqueous base, and $R^{14}$ represents a group which may comprise a carbon functionality comprising at least one carbon atom, where the carbon functionality controls polymer dissolution rate of the polymer blend into aqueous base. $R^{12}$, $R^{13}$, and $R^{14}$ may be non-identical groups. Subscripts d, e, and f represent the number of repeating units. Subscripts d and f may be integers greater than zero. For example d and f may each independently be in a range from 1 to 5,000. Subscript e may be an integer greater than or equal to zero. For example, e may be an integer in a range from 0 to 5,000.

$R^{12}$ is not limited to any specific carbon functional group, and may be selected from among conventional acid sensitive protecting groups, such as carbonates, tertiary esters, acetals, ketals, the like, and combinations thereof. For example, the acid sensitive protecting group may comprise a tert-butylacetate group, where $R^{12}$ may be:

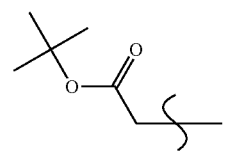

$R^{13}$ is not limited to any specific functional group, and may comprise functional groups which are substituted with —OH groups, —C(O)OH groups, —F, or combinations thereof. $R^{13}$ may comprise linear or branched alkyls, cycloalkyls, aromatics, arenes, or acrylics. For example. $R^{13}$ may be

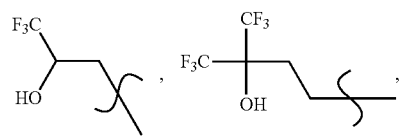

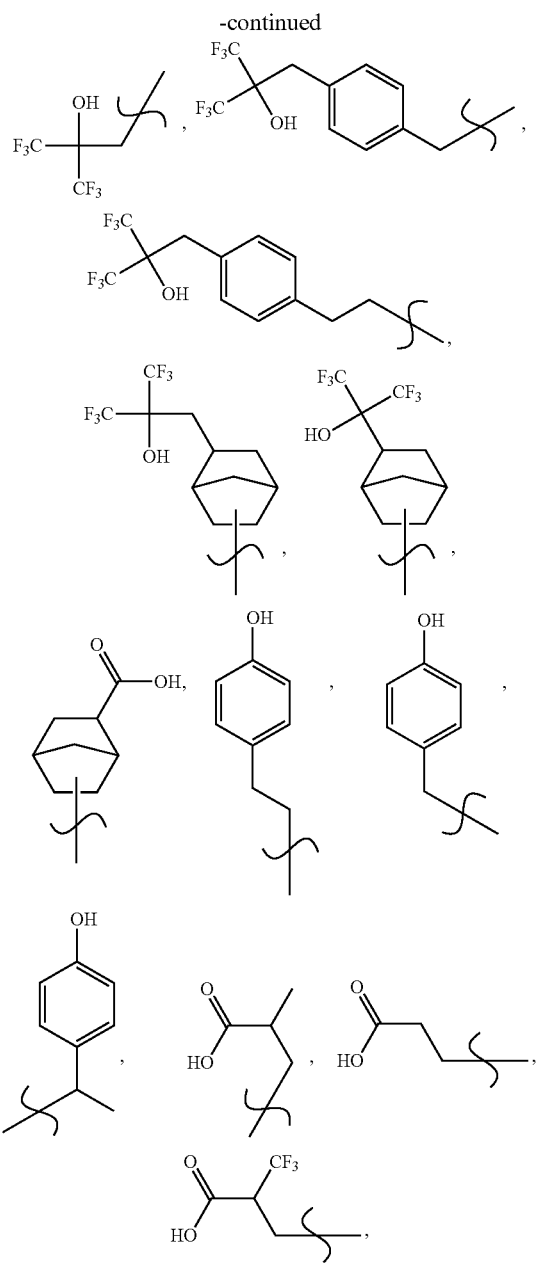

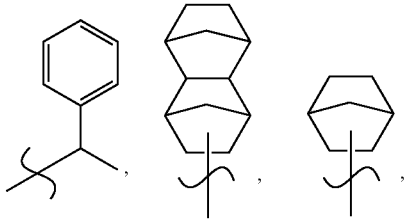

or the like.

$R^{14}$ is not necessarily limited to any specific functional group, and may comprise linear or branched alkyls, cycloalkyls, aromatics, arenes, acrylates, or combinations thereof. For example $R^{14}$ may be:

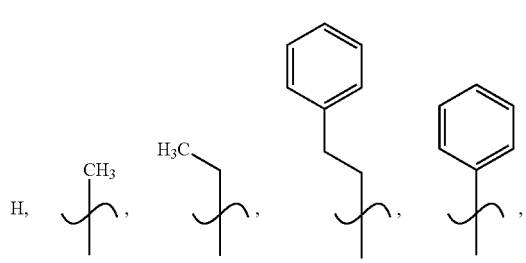

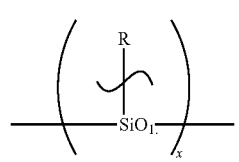

or the like.

The specific proportions and structures of $R^{12}$, $R^{13}$, and $R^{14}$ may be selected to provide a material suitable for photolithographic patterning processes.

In one embodiment, the second polymer of the polymer blend of this embodiment of positive-tone patternable low-k material may comprise a polymer of one monomer or a copolymer including at least two monomers and wherein the monomers of the copolymers are selected from a siloxane, silane, carbosilane, oxycarbosilane, silsesquioxane, alkyltri-alkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. In one embodiment, the second polymer of the polymer blend may comprise a copolymer of at least two monomers selected from siloxane, silane, silsesquioxane, carbosilane, or oxycarbosilane moieties. In one embodiment of the present disclosure, the second polymer of the polymer blend may comprise a copolymer of at least two monomers selected from an alkyltrialkoxysilane and/or a tetra-alkoxysilane. The molar ratio of the alkyltrialkoxysilane monomer in the copolymer ranges from 0 to 100%. The weight average molecular weight of the copolymer range from 100-5,000,000 g/mol, or from 500-50,000 g/mol. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer.

In another embodiment, the second polymer in the polymer blend for the positive-tone patternable low-k material is a polymer having the structural formula:

$$\left( \begin{array}{c} R \\ | \\ -SiO_1- \end{array} \right)_x$$

where $R^3$ may be a carbon functional group having at least one carbon atom and wherein the subscript x represents the number of repeating units and may be an integer greater than zero. The subscript q may be in a range from 4 to 50,000, such as from 10 to 1,000 for example. $R^3$ may comprise, for example, alkyls, cycloalkyls, aryl, or combinations thereof. Examples of $R^3$ include:

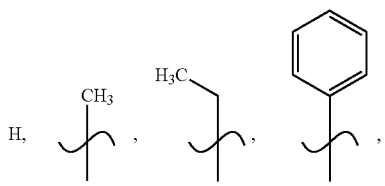

or the like.

In one embodiment, the second silsesquioxane polymer may be poly(methylsilsesquioxane) or copolymer, where $R^3$ is a methyl group, and x is an integer from 4 to 1,000. In another embodiment, x may be greater than 1,000. The second silsesquioxane polymer may also comprise a copolymer with siloxane, silane, carbosilane, oxycarbosilane, alkyltrialkoxysilane, or tetra-alkoxysilane. The second silsesquioxane polymer or copolymer structure may be caged, linear, branched, or combinations thereof. The silsesquioxane polymers of the present disclosure may comprise end groups comprising silanols, halosilanes, acetoxysilanes, silylamines, alkoxysilanes, and combinations thereof, which may undergo condensation reactions in the presence of an acid generated by a photoacid generator under exposure to radiation, followed by thermal baking. Polymer molecules of the second polymer may undergo chemical crosslinking with molecules of the first polymer or copolymer, the second polymer or copolymer, or a combination of these. In one embodiment of the present disclosure, the second silsesquioxane may be the silsesquioxane polymer or copolymer LKD 2021, LKD-2056 or LKD 2064 (products of JSR Corporation) which contain silanol end groups.

The silsesquioxane polymers or copolymers in the polymer blend may have a weight averaged molecular weight in the range from 400 to 500,000 g/mol, such as from 1500 to 10,000 g/mol, for example.

Other components of a positive-tone patternable low-k material include a photo acid generator, a casting solvent and a base additive. These components and their compositions are well known to those skilled in the art and are similar to those in the negative-tone patternable low-k materials discussed previously.

In one embodiment, a positive-tone patternable low-k material is used for via patterning.

The aforementioned patternable low-k materials act as a photoresist during patterning; they can be positive-tone or negative-tone, and sensitive to G-line, I-line, DUV (248 nm, 193 nm, 157 nm, 126 nm, and EUV (13.4 µm), an electron beam, or an ion beam. The patterning by exposure with light through a mask can be in a dry mode or an immersion mode wherein a liquid with a refractive index larger than that of air is inserted between the patternable low-k and the lens of the exposure tool.

The photosensitive can be a positive-tone or negative-tone photopatternable low-k material. Non-limiting examples of positive-tone or negative-tone photopatternable low-k material include a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The photosensitive dielectric material can be a silsesquioxane polymer or copolymer selected from the group consisting of poly(methylsilsesquioxane) (PMS), poly(p-hydroxybenzylsilsesquioxane) (PHBS), poly(p-hydroxyphenylethylsilsesquioxane) (PHPES), poly(p-hydroxyphenylethylsilsesquioxane-co-p-hydroxy-alpha-methylbenzyl silsesquioxane) (PHPE/HMBS), poly(p-hydroxyphenylethylsilsesquioxane-co-methoxybenzylsilsesquioxane) (PHPE/MBS), poly(p-hydroxyphenylethylsilsesquioxane-co-t-butylsilsesquioxane) (PHPE/BS), poly(p-hydroxyphenylethylsilsesquioxane-co-cyclohexylsilsesquioxane) (PHPE/CHS), poly(p-hydroxyphenylethylsilsesquioxane-co-phenylsilsesquioxane) (PHPE/PS), poly(p-hydroxyphenylethylsilsesquioxane-co-bicycloheptylsilsesquioxane) (PHPE/BHS), polyp-hydroxy-alpha-methylbenzylsilsesquioxane) (PHMBS), polyp-hydroxy-alpha-methylbenzylsilsesquioxane-co-p-hydroxybenzylsilsesquioxane) (PHMB/HBS), poly(p-hydroxy-alpha-methylbenzylsilsesquioxane-co-methoxybenzylsilsesquioxane) (PHMB/MBS), poly(p-hydroxy-alpha-methylbenzylsilsesquioxane-co-t-butylsilsesquioxane) (PHMB/BS), poly(p-hydroxy-alpha-methylbenzylsilsesquioxane-co-cyclohexylsilsesquioxane) (PHMB/CHS), poly(p-hydroxy-alpha-methylbenzylsilsesquioxane-co-phenylsilsesquioxane) (PHMB/PS), poly(p-hydroxy-alpha-methylbenzylsilsesquioxane-co-bicycloheptylsilsesquioxane) (PHMB/BHS), poly(p-hydroxybenzylsilsesquioxane-co-p-hydroxyphenylethylsilsesquioxane) (PHB/HPES), and poly(p-hydroxy-alpha-methylbenzylsilsesquioxane-co-p-alpha-methylbenzylsilsesquioxane) (PHMB/MBS).

The layer of photosensitive dielectric material typically has a thickness of from about 100 nm to about 2 um, about 250 nm to about 2 um, about 500 nm to about 2 um, about 250 nm to about 1 um, or about 500 nm to about 1 um. The photosensitive dielectric material can be layered onto the cured polymeric fill matrix and exposed nanotubes, for example, by centrifugation, spray-coating, spin coating, dip coating, doctor blade coating, chemical vapor deposition, plasma enhanced chemical vapor deposition, physical vapor deposition, atomic layer deposition, evaporation, or a combination thereof.

The pattern-wise exposing process can be accomplished in a variety of ways, including, for example, through a mask with a lithography stepper or a scanner with an exposure light source of G-line, I-line (365 nm), DUV (248 nm, 193 nm, 157 nm, 126 nm), Extreme UV (13.4 nm), an electron beam, or an ion beam. The patterning by exposure with light through a mask can be in a dry mode or an immersion mode wherein a liquid with a refractive index larger than that of air is inserted between the patternable low-k and the lens of the exposure tool. The pattern-wise exposing process also includes direct writing without the use of a mask with, for example, light, electron beam, ion beam, and scanning probe lithography. Other patterning techniques that can be used in the present disclosure include contact printing techniques such as nanoimprint lithography, embroising, micro contact printing, replica molding, microtransfer molding, micromolding in capillaries and solvent-assisted micromolding, thermal assisted embroising, inject printing, and the like. These patterning techniques can be applied once or multiple times to form an interconnect structure. The multiple patterning can be accomplished with one patterning technique or a combination of the techniques.

After forming the at least one interconnect pattern, the photosensitive dielectric material is typically, but not necessarily always, cured. Curing is performed by a thermal cure, an electron beam cure, an ultra-violet (UV) cure, an ion beam cure, a plasma cure, a microwave cure or a combination thereof. The conditions for each of the curing processes are well known to those skilled in the art. In one embodiment, an irradiation cure step is performed by a combination of a thermal cure and an ultra-violet (UV) cure wherein the wavelength of the ultra-violet (UV) light is from 50 to 300 nm and the light source for the ultra-violet (UV) cure is a UV lamp, an excimer (exciplex) laser or a combination thereof.

In one embodiment, the post patterning cure is a combined UV/thermal cure. This combined UV/thermal cure is carried on a UV/thermal cure module under vacuum or inert atmosphere, such as $N_2$, He, Ar or by vacuum. Typically, the UV/thermal cure temperature is from 100° C. to 500° C., with a cure temperature from 300° to 450° C. being more typical. The duration of the UV/thermal cure is from 0.5 min to 30 min with a duration from 1 min to 10 min being more typical. The UV cure module is designed to have a very low oxygen content to avoid degradation of the resultant dielectric materials.

The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 nm to 300 nm. Additionally, the light of the ultra-violet (UV) cure may be enhanced and/or diffused with a lens or other optical diffusing device known to those skilled in the art.

Figure 3:
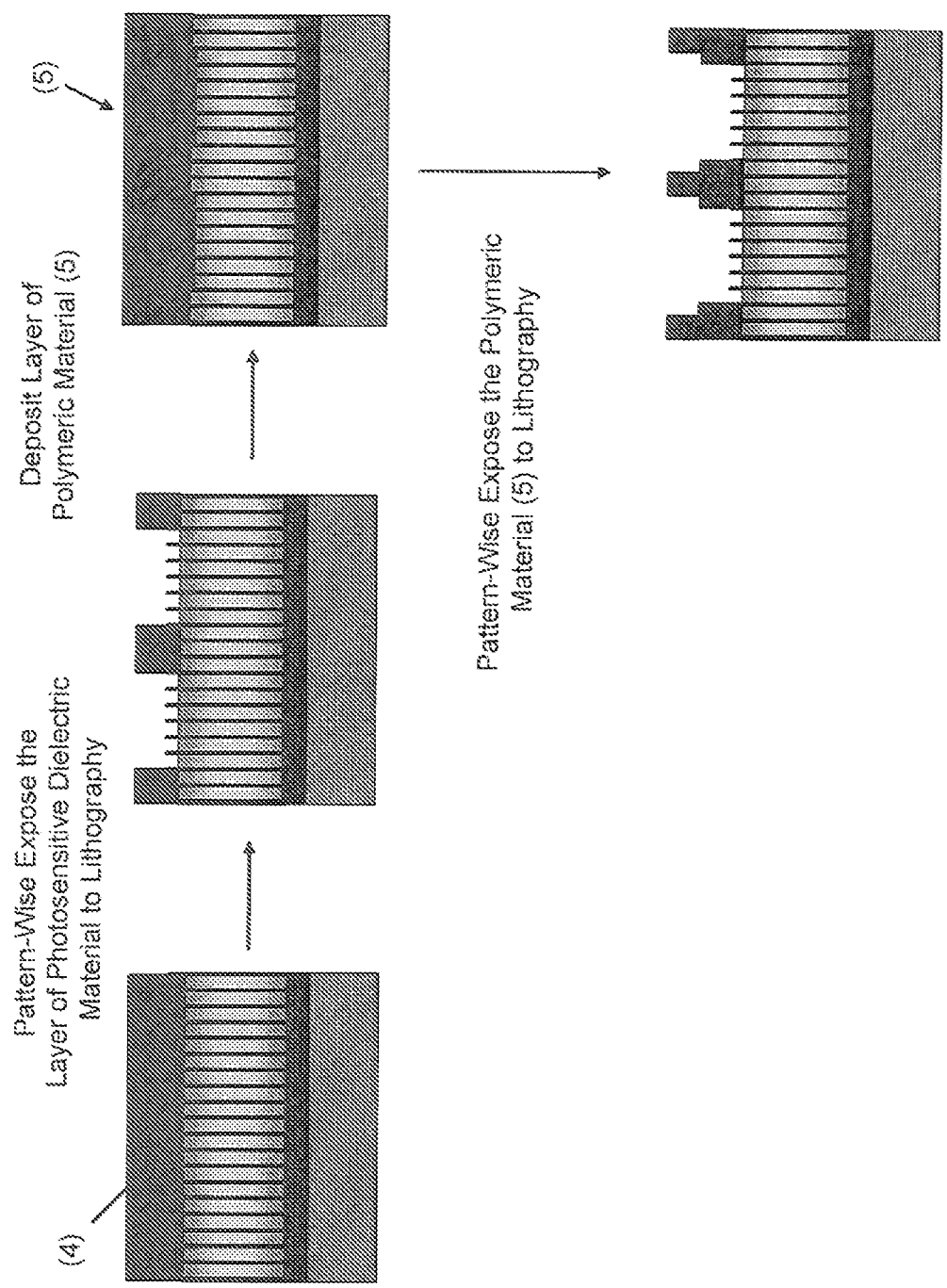
FIG. 3 is a depiction according to one aspect of the disclosure showing a method of pattern-wise exposing a layer of photosensitive dielectric material to lithography; optionally depositing another layer of polymeric material; and patter-wise exposing the polymeric material by lithography.

After patterning and optionally curing the photosensitive dielectric material, a second layer of polymeric material (5) can be applied as depicted in FIG. 3. See number (5). This polymeric material can be any photoresist material. As shown, the second photosensitive dielectric material fills via patterns and extends onto an upper surface of the first layer of photosensitive dielectric material. The second layer of polymeric material may comprise the same or different material as the first photosensitive dielectric material. The deposition processes and thickness mentioned above for the first photosensitive dielectric material are each applicable here for the second polymeric material. Typically, the first photosensitive dielectric material is a positive-tone material, and the second layer of polymeric material is either a negative-tone or a positive-tone material.

Next, the polymeric material (5) is patterned to form at least one second interconnect pattern within the second photosensitive dielectric material. The patterning of the second photosensitive dielectric material can be performed utilizing the same basic processing equipment, conditions and steps as those used for patterning the first photosensitive dielectric material.

After patterning the second photosensitive dielectric material, the structure can be cured. Note that some portion of the cured second photosensitive dielectric material can remain on the sidewalls of the at least one first interconnect pattern. If not previously cured, this curing step also cures the first photosensitive dielectric material.

An exemplary structure prepared as described above is shown in FIG. 1. FIG. 1 depicts a structure comprising an electrically conductive substrate (1) having a silicon wafer (1a) and a coating (1b) such as a dielectric film, NiPtSi, CoSi, TiN, or a combination thereof, wherein carbon nanotubes (2) are grown upon the electrically conductive substrate. A cured polymeric fill matrix comprising at least one latent photoacid generator (3) is embedded around the carbon nanotubes (2) but allows tips of the carbon nanotubes(2) to be exposed. A layer of patterned and cured photosensitive dielectric material (4) on the cured polymeric fill matrix (3) is shown, wherein tips of the carbon nanotubes (2) are exposed within the patterns. Also shown is a second layer of polymeric material (5), wherein the tips of the carbon nanotubes are exposed within the patterns.

Figure 2:
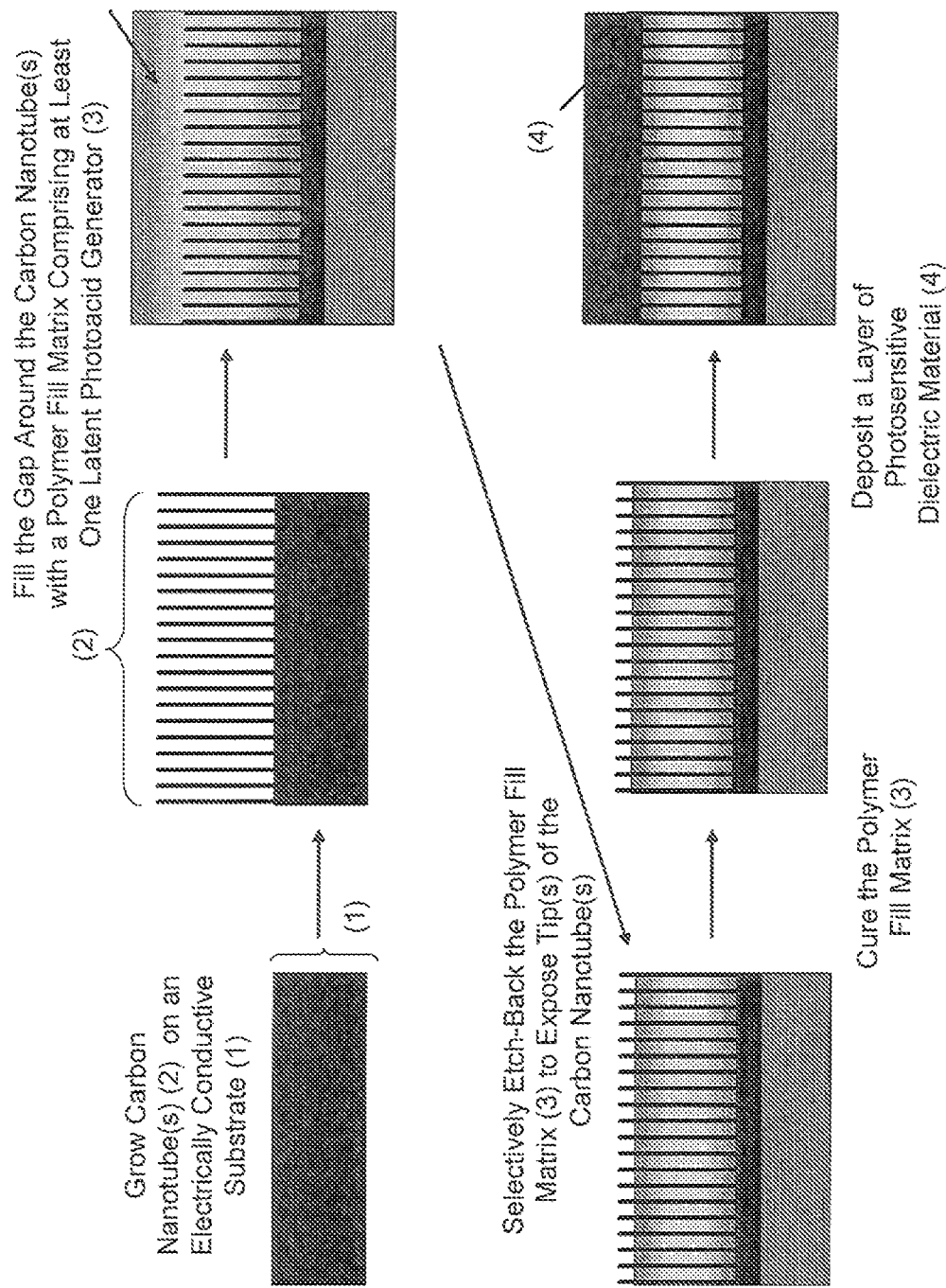
FIG. 2 is a depiction according to one aspect of the disclosure showing a method of filling the gap between carbon nanotubes grown on a conductive substrate with polymeric fill matrix comprising at least one latent photoacid generator; selectively etching back the polymeric fill matrix to expose tips of the carbon nanotubes; curing the polymeric fill matrix; and depositing a layer of photosensitive dielectric material thereon.

FIG. 2 shows the steps of growing carbon nanotubes (2) on an electrically conductive substrate (1), followed by filling the gap around the carbon nanotubes (2) with a polymeric fill matrix comprising at least one latent photoacid generator (3). After filling the gap, the polymeric fill matrix (3) is selectively etched-back to expose tips of the carbon nanotubes (2). Then, the polymeric fill matrix is cured and a layer of photosensitive dielectric material (4) is applied.

FIG. 3 shows the patter-wise exposure of the layer of photosensitive dielectric material to lithography followed by the deposition of a second layer of polymeric material (5) and pattern-wise exposure to lithography.

EXAMPLES

Example 1

Growing Carbon Nanotubes on a Conductive Substrate

Carbon nanotubes were grown on a conductive substrate using high temperature chemical vapor deposition (CVD) process. The conductive substrate is 10-30 A of Cobalt film (as the catalyst) deposited on 250 A of TiN film (as underlayer), which is further deposited on NiPtSi grown silicon wafer. Such substrate was introduced into the deposition chamber, which was kept at 725° C. The chamber pressure was increased to 320 torr. The substrate was then pre-treated with $NH_3$ gas (300 sccm for 30 seconds) before introduction of the carbon containing source ($C_2H_4$). 500 sccm of $C_2H_4$, after which it was flown for 10 minutes to grow the carbon nanotubes.

Example 2

Filling the Gap and Selectively Etching Back the Polymeric Fill Matrix

After growing the carbon nanotubes on the conductive substrate, the polymeric fill matrix NFC-1400 (a hydroxystyrene-based crosslinkable polymer; available from JSR Micro) was used as the polymeric fill matrix. The NFC-1400 was manually applied to the conductive substrate (having carbon nanotubes grown thereon) and the substrate was spun at 1500 rpm for 2 minutes. After which, the NFC-1400 coated substrate was baked at 200° C. for 5 minutes. The thickness of the NFC-1400 film was about 3-5 µm. The NFC-1400 coated carbon nanotubes were then introduced into an inductively coupled plasma source reactive ion etch chamber for selectively etching back the NFC-1400. The etch process was performed for 150 seconds at 150° C. with 30 mT chamber pressure and 2000 W power with 800 W RF bias power using a gas mixture of 100 sccm $NH_3$, 50 sccm Ar and 45 sccm $O_2$.

Example 3

Depositing Photosensitive Dielectric Material onto the Cured Polymeric Fill Matrix After the selectively etching back the polymeric fill matrix (i.e., the NFC-1400), the tips of carbon nanotubes were exposed. This structure was then subjected to a UV-thermal Cure at 400° C. for 20 minutes in the presence of $N_2$ gas. After curing, photosensitive dielectric material (Photo Patternable Low K (PPLK) material) was deposited by spin-coating. The thickness of photosensitive dielectric material was about 0.6 µm. The film was then baked at a temperature of 110° C. for 60 seconds, exposed using 248 nm lithography through a mask with a 14.5 mJ dose and −0.2 µm focus, and then post exposure baked for 60 seconds at 90° C. After lithography, the structure was subjected to an additional UV-thermal cure at 250° C. for 10 minutes in a $N_2$ environment. After the UV exposure, a second lithography was performed. During second lithography, 0.7 µm of negative photoresist (PR) material was deposited onto the patterned structure. The photoresist was baked at a temperature of 110° C. for 60 seconds, exposed through a mask, with 29 mJ dose, −0.1 um focus using 248 nm lithography and then post exposure baked at 90° C. for 60 seconds. The final structure following the second lithography step had two via openings and tips of the carbon nanotubes exposed.

Having described the subject matter of the present disclosure by way of illustration and example for purposes of clarity of understanding, it will be apparent to one of ordinary skill in the art that the same can be performed by modifying or changing the subject matter within a variety of conditions, formulations and other parameters without affecting its scope or any specific embodiment thereof, and that such modifications or changes are intended to be encompassed within the scope of the appended claims.

All publications, patents, and patent applications mentioned in this specification are indicative of the level of skill of those skilled in the art to which this disclosure pertains, and are herein incorporated by reference in their entirety to the same extent as if each individual publication, patent or patent application was specifically and individually indicated to be incorporated by reference.

It is claimed:

1. A method of patterning a photosensitive material on a polymeric fill matrix comprising at least one latent photoacid generator comprising:
    embedding a polymeric fill matrix comprising at least one latent photoacid generator around carbon nanotubes grown upon a conductive substrate;
    curing the polymeric fill matrix;
    depositing a layer of photosensitive material directly onto the cured polymeric fill matrix; and
    forming a pattern with at least one opening in the layer of photosensitive material with lithography.

2. The method of claim 1, wherein the polymeric fill matrix comprises polymers or copolymers or blends of polymers and/or copolymers.

3. The method of claim 2, wherein the polymeric fill matrix comprises a poly(hydroxystyrene) based polymer or copolymer or blends of poly(hydroxystyrene) based polymers and/or copolymers.

4. The method of claim 3, wherein the poly(hydroxystyrene) based polymer or copolymer or blends of poly(hydroxystyrene) based polymers and/or copolymers comprise(s) aromatic rings, wherein some portion of the aromatic rings contain anthracenylmethyl or naphthalene groups.

5. The method of claim 4, wherein the polymeric fill matrix comprises a blend of poly(4-hydroxystyrene) and 9-anthracenylmethylated poly(hydroxy styrene).

6. The method of claim 1, wherein the at least one latent photoacid generator is selected from the group consisting of triarylsulfonium salts, diaryliodonium salts, pholoroglucinyl, O,O-dinitrobenzyl sulfonates, benzylsulfones, 1,1,1-trihalides, quartary ammino salts, and a combination thereof.

7. The method of claim 1, wherein the polymeric fill matrix is cured by heat, plasma, irradiation of electromagnetic wave such as ultra-violet (UV) light, electron beam, ion beam, microwave, or combination thereof.

8. The method of claim 1, wherein the photosensitive material is selected from a positive tone or negative tone photosensitive dielectric material.

9. The method of claim 1, wherein the lithography comprises pattern-wise exposure to an irradiation source.

10. The method of claim 9, wherein the irradiation source is selected from G-line, I-line, DUV (248 nm, 193 nm, 157 nm, 126 nm), EUV (13.4 nm, 5.6 nm), electron beam, and ion beam.

11. The method of claim 9, wherein the pattern-wise exposure to an irradiation source comprises the use of a mask or a direct write.

12. The method of claim 1, wherein the pattern is formed by single or multiple pattern-wise exposure(s).

13. The method of claim 1, wherein the pattern is formed with reactive ion etching.

14. A method of patterning a photosensitive material on a polymeric fill matrix comprising at least one latent photoacid generator comprising:
    embedding a polymeric fill matrix comprising at least one latent photoacid generator around carbon nanotubes grown upon a conductive substrate;
    selectively etching back the polymer fill matrix to expose tips of the carbon nanotubes;
    curing the polymeric fill matrix;
    depositing a layer of photosensitive dielelectric material directly onto the cured polymeric fill matrix; and
    forming a pattern with at least one opening in the layer of photosensitive material with lithography.

15. The method of claim 14, wherein the at least one latent photoacid generator is selected from the group consisting of triarylsulfonium salts, diaryliodonium salts, pholoroglucinyl, O,O-dinitrobenzyl sulfonates, benzylsulfones, 1,1,1-trihalides, quartary ammino salts, and a combination thereof.

16. The method of claim 14, wherein the polymer matrix is cured using a UV-thermal cure.

17. The method of claim 14, wherein the polymer fill matrix is selectively etched back using reactive ion etching.

18. The method of claim 17, wherein the reactive ion etching is performed using inductively coupled plasma, capacitively coupled plasma, oxidizing plasma, reducing plasma, or a combination thereof.

19. The method of claim 17, wherein the reactive ion etching is performed using oxidizing plasma comprising $O_2$, CO, $CO_2$, or a combination thereof.

20. The method of claim 17, wherein the reactive ion etching is performed using reducing plasma comprising $H_2$, $NH_3$, or a combination thereof.

* * * * *